(12) United States Patent
Zanoni et al.

(10) Patent No.: US 8,442,402 B1
(45) Date of Patent: May 14, 2013

(54) WIDE BAND DIGITAL RECEIVER: SYSTEM AND METHOD

(75) Inventors: Raymond Zanoni, Columbia, MD (US); Oliver S. King, Frederick, MD (US); Kim S. Jepsen, Ellicott City, MD (US)

(73) Assignee: Rockwell Collins, Inc., Cedar Rapids, IA (US)

(*) Notice: Subject to any disclaimer, the term of this patent is extended or adjusted under 35 U.S.C. 154(b) by 116 days.

(21) Appl. No.: 13/204,158

(22) Filed: Aug. 5, 2011

(51) Int. Cl.
*H04B 10/00* (2006.01)

(52) U.S. Cl.
USPC ............... 398/115; 398/202; 341/137

(58) Field of Classification Search .............. 341/137
See application file for complete search history.

(56) References Cited

U.S. PATENT DOCUMENTS

| | | | |
|---|---|---|---|
| 6,118,396 | A | 9/2000 | Song |
| 6,459,522 | B2 | 10/2002 | Yariv |
| 6,525,682 | B2 | 2/2003 | Yap et al. |
| 6,661,361 | B1 | 12/2003 | Lewis et al. |
| 6,700,517 | B1 | 3/2004 | Kellar |
| 7,868,799 | B1 | 1/2011 | Price et al. |
| 7,876,246 | B1 | 1/2011 | Price et al. |
| 2002/0163454 | A1* | 11/2002 | Yap et al. ............. 341/137 |

OTHER PUBLICATIONS

Clark et al., Photonics for RF Front Ends, IEEE microwave magazine, May 2011, 9 pages.
Clark et al., Coherent Optical Phase-Modulation Link, IEEE Photonics Technology Letters, Aug. 15, 2007, 3 pages, vol. 19, No. 16.
Valley et al., Photonic analog-to-digital converters: fundamental and practical limits, Integrated Optical Devices, Nanostructures, and Displays, Proceedings of SPIE, 2004, 11 pages, vol. 5618.
Valley, George C., Photonic Analog-to-Digital Converters, A Tutorial, The Aerospace Corporation, 2009, 48 pages.
Valley, George C., Photonic analog-to-digital converters, The Aerospace Corporation, Mar. 5, 2007, vol. 15, No. 5, 28 pages.
Zibar et al., Digital Coherent Receiver Employing Photonic Downconversion for Phase Modulated Radio-over-Fibre Links, downloaded on Aug. 2, 2010 from IEEE Xplore, 4 pages.
Zibar et al., Digital Coherent Receiver for Phase-Modulated Radio-Over-Fiber Optical Links, IEEE Photonics Technology Letters, Feb. 1, 2009, 3 pages, vol., 21, No. 3.
U.S. Appl. No. 13/240,226, filed Sep. 22, 2011, Zanoni et al.
U.S. Appl. No. 13/536,929, filed Jun. 28, 2012, Zanoni et al.
U.S. Appl. No. 13/626,642, filed Sep. 25, 2012, Zanoni et al.

\* cited by examiner

*Primary Examiner* — Kenneth N Vanderpuye
*Assistant Examiner* — David Lambert
(74) *Attorney, Agent, or Firm* — Donna P. Suchy; Daniel M. Barbieri

(57) ABSTRACT

A wide band digital RF receiver includes an RF front end configured to convert a RF signal into an IF signal. A wide band digital receiver also includes a photonic Analog-to-Digital Converter (pADC), and a digital processor. The pADC includes a photonic sampler that phase-encodes a stream of optical pulses with the IF signal to obtain phase-encoded optical pulses, and that amplitude-encodes an identical stream of optical pulses with the IF signal to obtain amplitude-encoded optical pulses. The pADC also includes a photonic processor and an electronic quantizer. The photonic processor processes the phase-encoded optical pulses by way of an I channel and a Q channel, and processes the amplitude-encoded optical pulses by way of an amplitude channel.

19 Claims, 14 Drawing Sheets

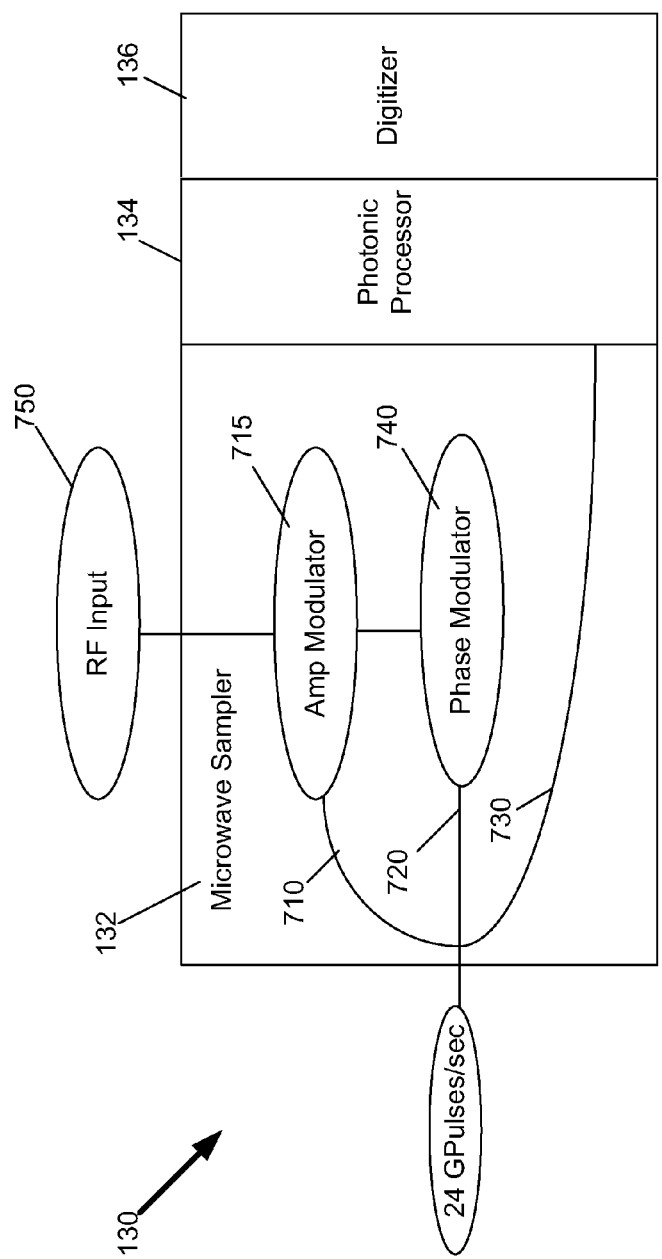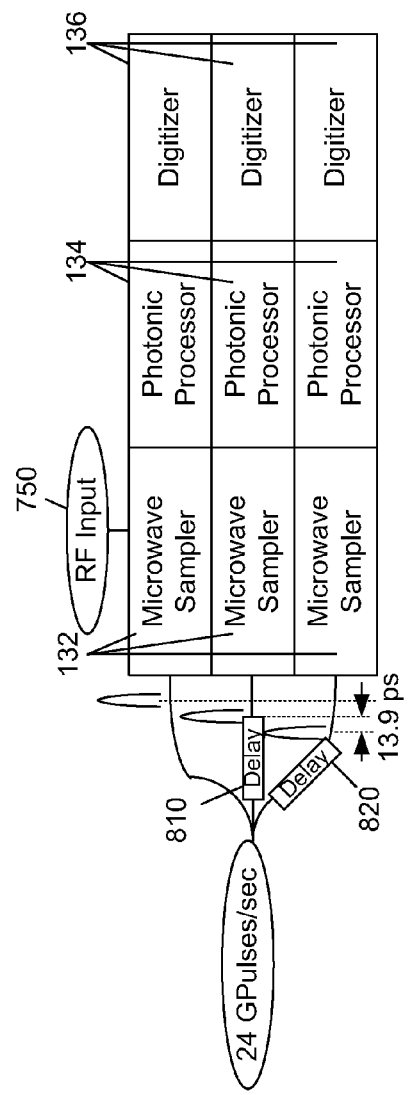

US 8,442,402 B1

WIDE BAND DIGITAL RECEIVER: SYSTEM AND METHOD

FIELD OF THE INVENTION

The present specification relates to a wide band radio frequency (RF) receiver More particularly, the present specification relates to a wide band receiver that includes a photonic analog-to-digital converter (ADC).

RF system designers have long been aware that wide bandwidth, high resolution ADCs enable capabilities such as wide band receivers, flexible software defined radio system architectures, and digital radar. Fundamental performance limits of conventional electronic ADCs (eADCs) significantly constrain the potential of these systems, such as systems operating wide band in excess of several GHz. Conventional eADCs do not have sufficient bandwidth without breaking up the bandwidth range into smaller channels or having to scan the range with a narrow band radio receiver.

Therefore, there is a need for a wide band digitizer that includes eADCs and has good operating characteristics (e.g, high resolution, large spur free dynamic range) with bandwidths in excess of 1-2 Ghz, of interest to both the wide band military and/or commercial operations. There is also a need for a wide band digitizer including a photonic ADC that does not have certain performance limitations of conventional electronic ADCs. There is still further a need for a wide band receiver, a software defined radio, and digital radar including a photonic ADC that does not have certain performance limitations of conventional electronic ADCs

SUMMARY OF THE INVENTION

An exemplary embodiment relates to a wide band RF receiver. The wide band receiver includes an RF front end configured to convert an RF signal into an IF signal, a photonic Analog-to-Digital Converter (pADC), and a digital processor. The pADC includes a photonic sampler that is configured to phase-encode the IF signal on a stream of optical pulses to obtain phase-encoded optical pulses, and to amplitude-encode the IF signal on another identical stream of optical pulses to obtain amplitude-encoded optical pulses. The pADC also includes a photonic processor and an electronic quantizer. The photonic processor processes the phase-encoded optical pulses using an I channel and a Q channel, and processes the amplitude-encoded optical pulses using an amplitude channel.

Another exemplary embodiment relates to a method of processing an RF signal. The method includes converting, by a receiver front end, the RF signal into an IF signal. The method also includes phase-encoding, by a photonic sampler, the IF signal on a stream of optical pulses to obtain phase-encoded optical pulses. The method further includes amplitude-encoding, by the photonic sampler, the IF signal on another identical stream of optical pulses to obtain amplitude-encoded optical pulses. The method still further includes processing, by a photonic processor, the phase-encoded optical pulses by way of an I channel and a Q channel. The method also includes processing, by the photonic processor, the amplitude-encoded optical pulses by way of an amplitude channel.

Another embodiment related to a computer readable medium storing computer program product that, when executed by a computer, causes the computer to perform a functions of:
convert the RF signal into an IF signal;
phase-encode the IF signal on a stream of optical pulses to obtain phase-encoded optical pulses;
amplitude-encode the IF signal on another identical stream of optical pulses to obtain amplitude-encoded optical pulses;
process the phase-encoded optical pulses by way of an I channel and a Q channel; and
process the amplitude-encoded optical pulses by way of an amplitude channel.

BRIEF DESCRIPTION OF THE DRAWINGS

Exemplary embodiments are hereafter described with reference to the accompanying drawings, wherein like numerals denote like elements; and:

FIG. 7 is drawing of a photonic sampler portion of a photonic ADC that can be utilized as part of the wide band receiver of FIG. 1 according to an exemplary embodiment;

FIG. 8 is drawing showing the use of time delays for providing interleaved inputs to a photonic ADC that can be utilized as part of the wide band receiver of FIG. 1 according to an exemplary embodiment;

DETAILED DESCRIPTION OF THE PREFERRED EMBODIMENTS

Figure 1:
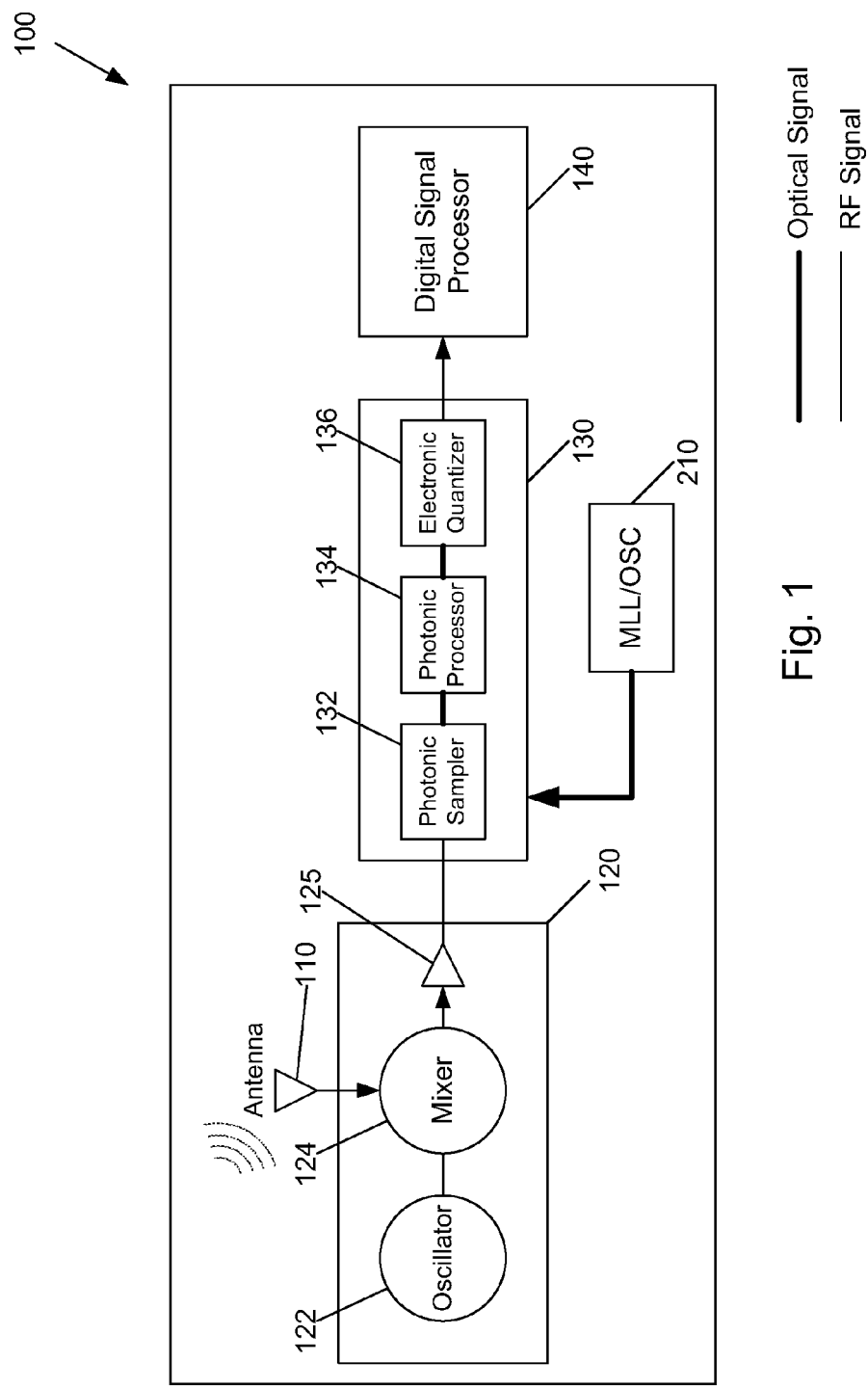
FIG. 1 is a general block diagram of a wide band receiver according to an exemplary embodiment.

Before describing in detail the particular improved system and method, it should be observed that the invention includes, but is not limited to, a novel structural combination of optical components and not in the particular detailed configurations thereof. Accordingly, the structure, methods, functions, control and arrangement of components have been illustrated in the drawings by readily understandable block representations and schematic drawings, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

At least one embodiment relates to a wide band, high spurious free dynamic range (SFDR) ADC that uses an optically interleaved electronic ADC architecture. With reference to FIG. 1, a receiver 100 can be used in any receiving applications, including but not limited to applications associated with radios (e.g, software defined radio, radio receivers capable of wide band receiver operations, etc.), radars (e.g, a digital radar), and sensors. Receiver 100 includes a wide band antenna 110. Antenna 110 receives a wide band signal (e.g., a 70 GHz signal), which is down-converted by a front end 120 to an appropriate intermediate frequency, e.g., a frequency centered near 18 GHz. The down-converted signal can preferably be a wide band signal spanning a bandwidth of from 0 Hz to 35 GHz. The front end 120 includes an oscillator 122, a mixer 124 and a low noise amplifier 125. The IF signal is digitized by a photonic ADC (pADC) 130 and processed by a digital signal processor 140. The pADC 130 includes a photonic sampler 132, a photonic processor 134, and electronic quantizer 136. The output of the electronic quantizer 136 is provided to the digital signal processor 140, which outputs digital information (e.g., radar tracking information) for further processing. The current state of the art for electronic ADCs provides for a capability of digitizing signals with bandwidths of up to 20 GHz at no more than 5.7 effective number of bits (ENOB) resolution. In one embodiment, applicants believe that receiver 100 exceeds the current state of the art by providing up to a 35 GHz instantaneous bandwidth (IBW) pADC that is capable of up to 8 ENOB and 75 db SFDR.

Further, the pADC 130 utilized in the wide band receiver 100 according to one embodiment can advantageously provide a scalable architecture referred to as multi-dimensional quantization (MDQ), and allows for increasing the IBW of a wide band receiver to up to 35 GHz while maintaining a resolution of around 8 ENOB. Details of photonic ADCs are described in U.S. Pat. No. 7,876,246, and U.S. Pat. No. 7,868, 799, which are incorporated in their entirety herein by reference.

Figure 2:
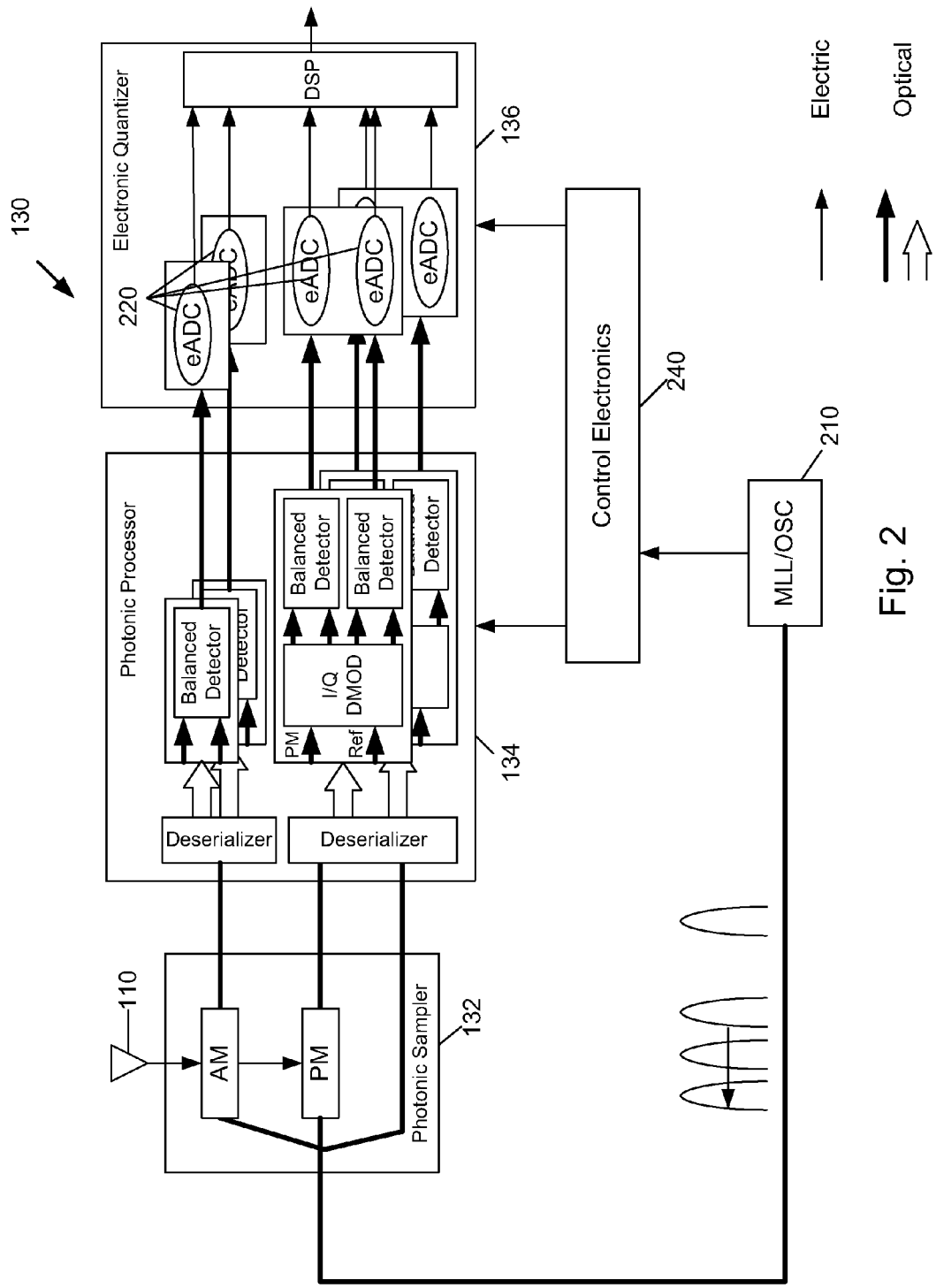
FIG. 2 is a drawing of a photonic ADC that can be utilized as part of the wide band receiver of FIG. 1 according to an exemplary embodiment.

FIG. 2 shows in more detail the components making up the pADC 130 utilized in a wide band digitizer of a wide band receiver 100 according to a first embodiment. An RF signal received by an antenna 110 is downconverted to an IF signal by a front end (see also FIG. 1), and the IF signal is phase and amplitude encoded onto a stream of optical pulses generated by a low phase noise mode locked laser (MLL) 210. Alternatively, the amplitude modulator (AM) and phase modulator (PM) can be provided with an input directly from a mixer or an LNA instead of from the antenna 110 (see, for example, mixer 124 and LNA 125 in FIG. 1). The resultant optical pulses are demodulated in three dimensions (that is, on three separate channels) as In-phase (I), Quadrature (Q), and amplitude information. Each dimension is quantized by the electronic quantizer 136 using, for example, conventional electronic ADCs (eADCs) 220. The amplitude dimension is used to remove any $2\pi$ phase ambiguity introduced in cases where the phase modulator is driven through more than one $2\pi$ phase rotation. In the first embodiment, the quantized signal is reconstructed such that the ENOB of the pADC 130 is higher than that of the constituent eADCs 220. Further, the SFDR of the pADC 130 is increased over that of constituent eADCs 220, and furthermore deserialization can be used to double the sample rate above that of an eADC 220. FIG. 2 shows deserializers 230 provided on the I channel, the Q channel, and the amplitude channel for effectively doubling the sample rate. In alternative configurations, based on system requirements, the sample rate can be effectively tripled quadrupled, etc., by using plural deserializers in the manner as described above. In the first embodiment, the performance of the pADC 130 is determined by the low phase noise of the pulsed laser (MLL/OSC) 210 and the aperture window that is defined by the optical pulse width that samples the RF waveform at the phase modulation, which provides better performance than by using a continuous wave (CW) laser as input to the pADC.

Specifically, the following elements shown in FIG. 2 are utilized in the pADC architecture. The MLL 210 provides low jitter, high resolution rate optical pulses. A microwave sampler 132, also referred to herein as a photonic sampler, encodes the RF signal onto the phase and amplitude of the optical pulse stream. See FIG. 7 for more exemplary details of the microwave sampler 132, which will also be discussed in more detail hereinbelow. A photonic processor 134 contains components for optical deserialization, I/Q demodulation, and detection. An electronic quantizer 136, also referred to herein as a digitizer, has three eADCs 220 per deserialized channel, with associated calibration, memory and processing functionality. A different number of eADCs per deserialized channel, such as two, four, five, etc., may be utilized in the digital platform while remaining within the spirit and scope of the invention. Also, control electronics 240 are provided for the pADC 130, for managing the constituent elements making up the pADC 130. The Control Electronics 240 conditions a central clock signal output by the MLL/OSC 210 such that the other components of the wide band receiver 100 are clocked off the central clock signal.

Figure 3:
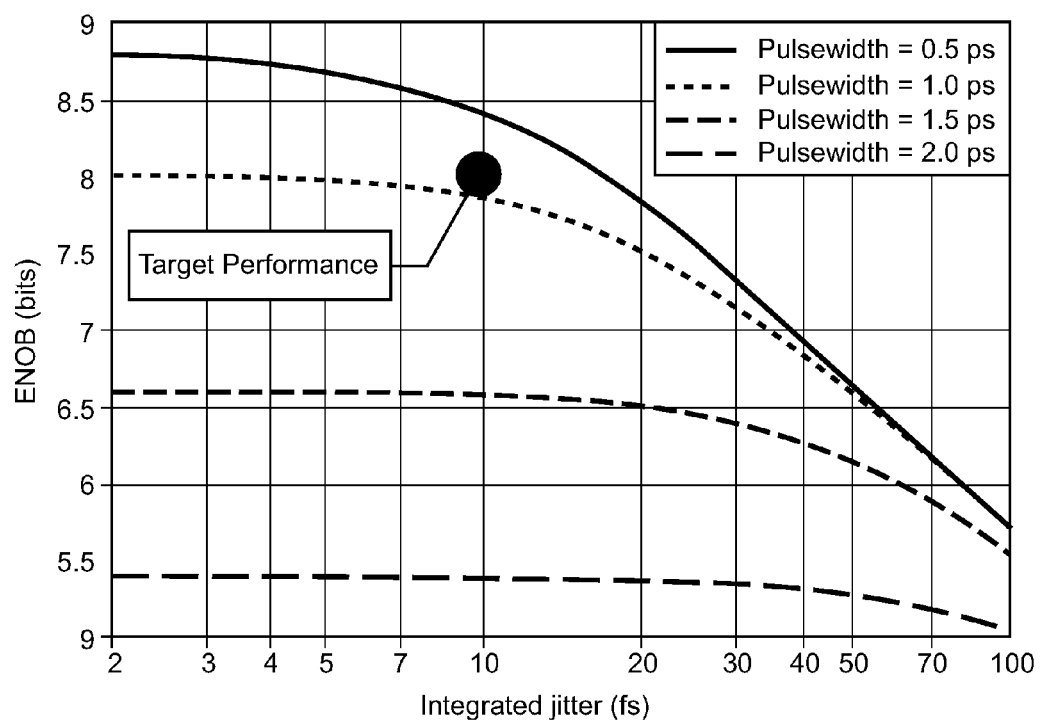
FIG. 3 is a plot showing simulation results of ENOB v. optical pulse timing jitter for the wide band receiver illustrated in FIG. 1 according to an exemplary embodiment.

FIG. 3 is a plot that shows the results of a parametric study of ENOB performance of a pADC 130 utilized in an IF stage of a wide band receiver 100 according to the first embodiment that operates at 35 GHz. Design parameters considered include optical pulse width, timing jitter, microwave sampler optical pulse shift magnitude, and ENOB of the eADCs. In particular, FIG. 3 shows the results of a simulation of ENOB versus optical pulse timing jitter for various pulsewidths for a pADC architecture utilized in the first embodiment, in which it is assumed that each eADC 220 is capable of 6.0 ENOB. Based on the results shown in FIG. 3, with a MLL 210 having 10 femtoseconds (fs) of jitter and a pulsewidth on the order of 0.5 picoseconds (ps), the pADC 130 utilized in a wide band receiver 100 according to one embodiment achieves 8 ENOB with 6 ENOB eADCs provided in the electronic quantizer 136 of the pADC 130.

Figure 4:
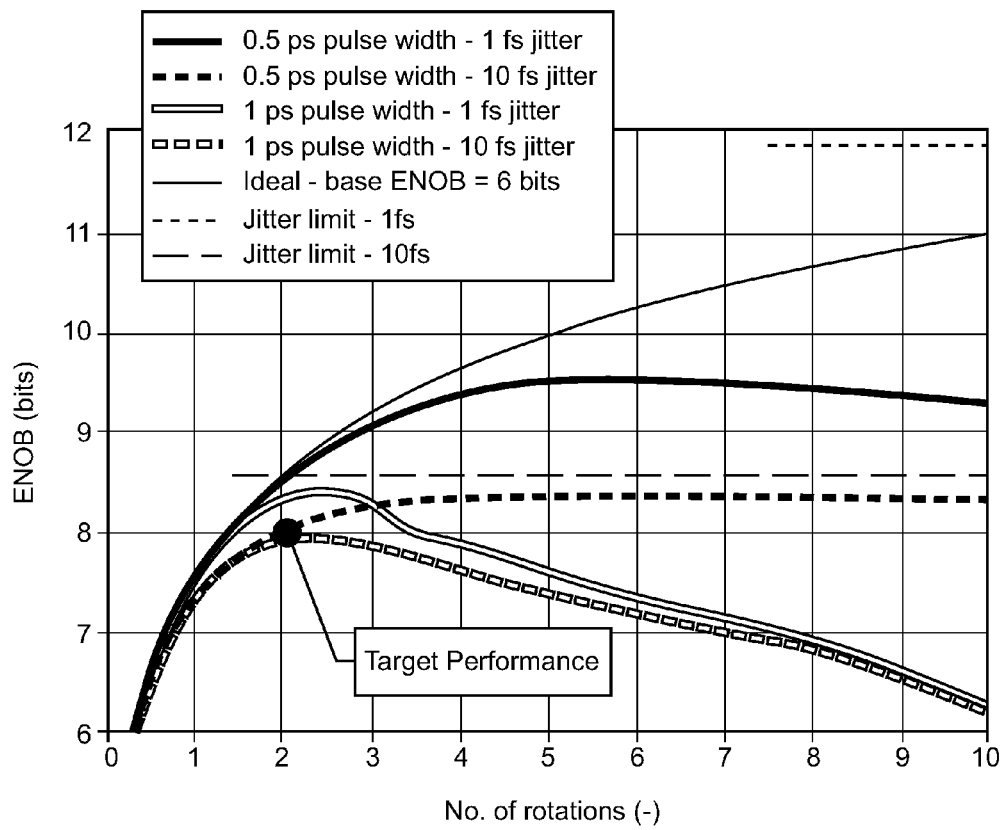
FIG. 4 is a plot showing simulation results of ENOB v. number of $2\pi$ rotations for the wide band receiver illustrated in FIG. 1 according to an exemplary embodiment.

FIG. 4 is a plot that shows the role of the magnitude of phase shift induced by the microwave sampler utilized in the pADC 130 of a wide band receiver 100 of the first embodiment, in which the x-axis indicates the total number of $2\pi$ phase rotations induced by a full scale RF input signal, and in which it is assumed that each eADC is capable of 6.0 ENOB. As seen in the FIG. 4 plot, with the requirements of an MLL 210 as discussed above, two phase rotations are sufficient for 8 ENOB performance.

Figure 5:
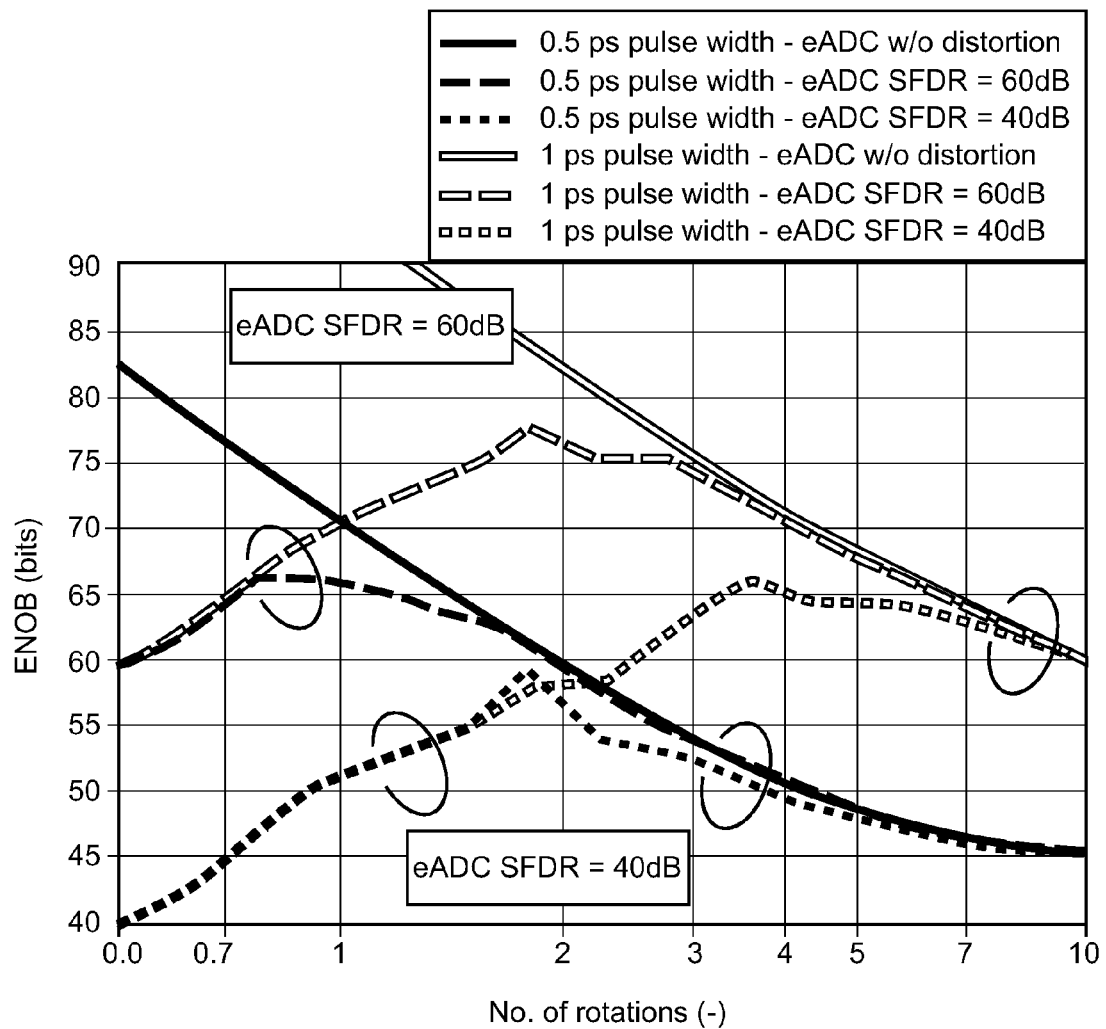
FIG. 5 is a plot showing simulation results of SFDR v. number of $2\pi$ rotations for the wide band receiver illustrated in FIG. 1 according to an exemplary embodiment.

SFDR is another critical performance measure that typically is considered by persons of ordinary skill in the art for receiver applications. FIG. 5 is a plot that shows the results of a simulation of SFDR for a pADC 130 utilized in a wide band receiver 100 according to the first embodiment as a function of the number of phase rotations, with the same assumptions for eADCs 220 as mentioned above. In the simulation that was performed to obtain the FIG. 5 plot, SFDR was limited by the finite pulse width. The results shown in FIG. 5 indicate that with an MLL 210 having 10 fs of timing jitter and a pulse width of 0.5 ps, the pADC 130 achieved >75 dB SFDR (assuming eADCs 220 have 60 dB SFDR).

Based on the simulations performed as discussed above, system requirements and design parameters lead to flow down specifications for each subsystem making up the wide band receiver 100 of FIG. 1. Beginning with the electronic quantizer 136 and working upstream through the photonic processor 134 and the photonic sampler 132 and then the front end 120, a system and method and computer readable medium (e.g., a computer disk or memory) storing computer program code for bridging the performance gap between conventional ADCs and a wide band receiver 100 having a pADC 130 according to the first embodiment can be obtained.

The bandwidth and ENOB of the eADCs 220 used in the pADC 130 impose constraints on the performance of the overall wide band receiver 100 of the first embodiment. In general, it is possible to trade off bandwidth and ENOB performance. With respect to the electronic quantizer 136 making up part of the pADC 130 of the wide band receiver 100 FIG. 1, a commercially available wide band digitizer may be used that has sufficient performance specifications. For example, there are currently available wide band digitizer s (on the order of 15 to 18 GHz, with modest ENOB specifications in the range of 4.0-4.5 ENOB). For example, Tektronix Component Solutions Inc. makes a 6 GHz bandwidth digitizer with 6 ENOB and 60 dB SFDR, which can be utilized in the first embodiment. Other commercially available digitizers may be used in the wide band receiver 100 according to the first embodiment, while remaining within the spirit and scope of the invention.

The Tektronix digitizer has a high ENOB over a large frequency range (e.g., 6 bits over 6 GHz), making it a good candidate for use as the electronic quantizer 136 of the pADC 130 of wide band receiver 100 FIG. 1. Also, the Tektronix digitizer can be synchronously clocked to the optical pulse stream with less than 150 fs error, and it has a printed circuit board (PCB) construction that makes it suitable for radar and other type of military applications. The PCB can accept two temporally demultiplexed optical pulses for each of the three dimensions of I, Q and amplitude. Three PCBs, each operating with a 12 GHz bandwidth, can be used as the electronic quantizer 136 that can digitize signals within a composite bandwidth of 36 GHz in one specific implementation of the first embodiment.

Figure 6:
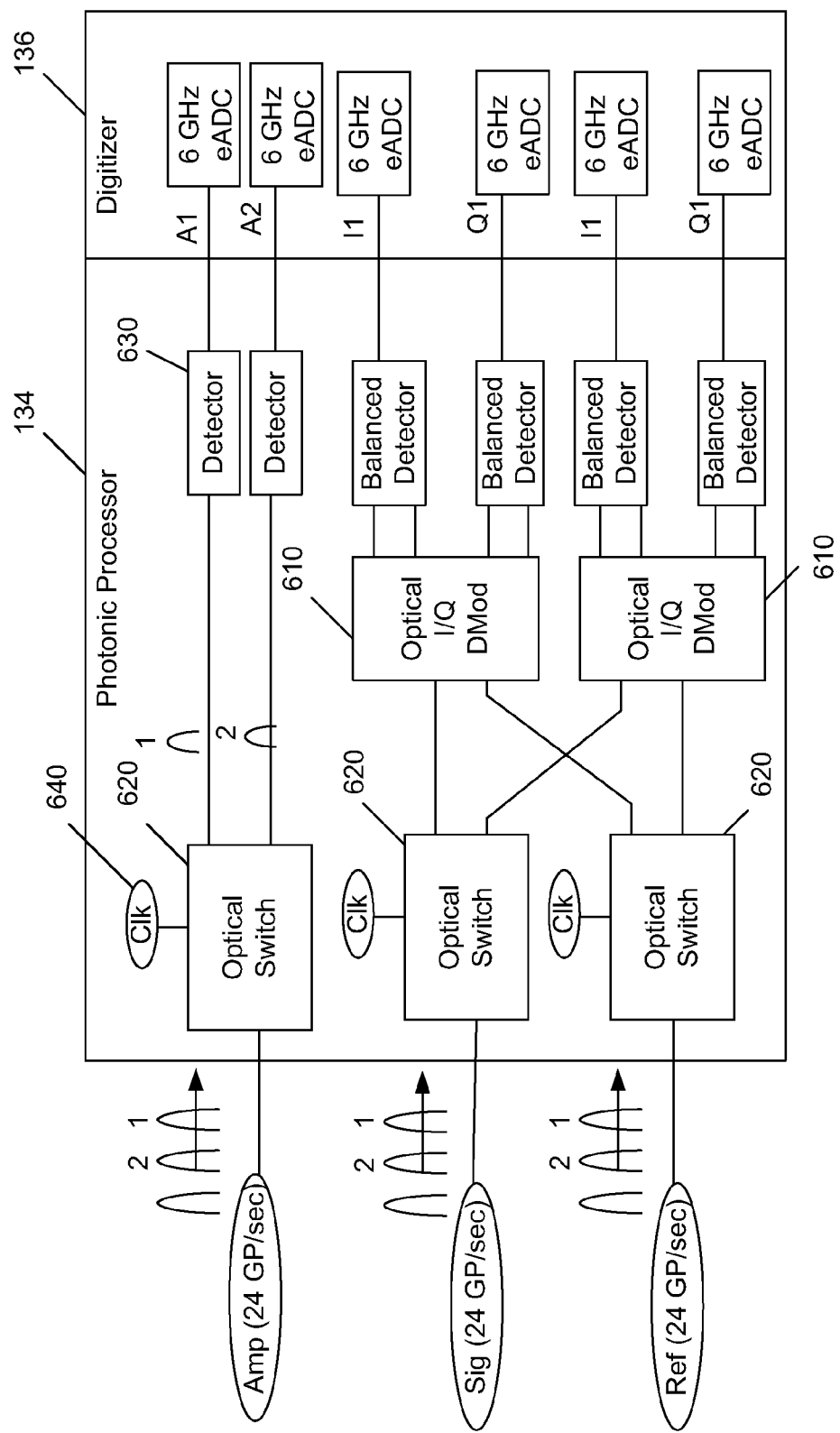
FIG. 6 is drawing of a photonic processor portion and an electronic quantizer portion of a photonic ADC that can be utilized as part of the wide band receiver of FIG. 1 according to an exemplary embodiment.

FIG. 6 shows one possible implementation of a photonic processor 134 that can be used in the wide band receiver 100 according to the first embodiment. The photonic processor 134 of the pADC 130 of the wide band receiver 100 of FIG. 1 includes I/Q demodulators 610, deserializing optical switches 620, and balanced photodetectors 630 for implementing a wide (e.g., 12 GHz) digitizer band. Each optical switch 620 can be a lithium niobate switch, such as one made by E-O Space Inc. Each I/Q demodulator 610 can be a 90° optical hybrid, such as one made by Optoplex, Inc. Each balanced photodetector 630 can be a InP, 20 GHz bandwidth balanced photodetector, such as one made by $U^2T$ Inc. Other commercially available switches, I/Q demodulators, and balanced photodetectors may be used in the wide band receiver 100 of the first embodiment, while remaining within the spirit and scope of the invention. By using such devices in a preferred implementation of the first embodiment, receiver 100 is well suited for heterogeneous Si/InP chip scale integration, which is highly desirable for military and other applications requiring durable and long-lasting components. The optical switches 620 are clocked at an appropriate clocking rate by clock pulses 640 provided by a clock circuit (not shown), so that the pADC 130 is synchronously clocked to the 24 GPulse/s input optical pulse stream.

The elements of the photonic sampler 132 of the pADC 130 of the wide band receiver 100 of FIG. 1 are shown in more detail in FIG. 7. On entering the photonic sampler 132, the power of a 24 Gpulse/s optical pulse stream output from the mixer 124 of the front end 120 is split into three optical paths 710, 720, 730. Approximately 1% of the power is provided to path 710 which includes an amplitude modulator 715, to be used to track the number of $2\pi$ phase changes encoded on the signal by a phase modulator. The balance of the power (the other 99%) is split into two paths, one which is phase modulated by a phase modulator 740 and the other that is used as a reference signal by the photonic processor 134 for I/Q demodulation. One of ordinary skill in the art will recognize that a small amount of power other than 1% of the total signal strength of the optical pulse stream, such as between 0.5% to 5%, can be utilized for providing an appropriate signal onto the amplitude modulation branch, while remaining within the spirit and scope of the invention. An RF signal 750 received by the RF antenna 110 (see FIG. 1) is modulated with the optical pulse stream by the amplitude modulator 715 and by the phase modulator 740.

Sampling a 36 GHz signal at the Nyquist rate requires a sampling rate of 72 Gsamples/second (Gsa/s). In order to achieve 72 Gpulses/s, the first embodiment pulse interleaves three 24 Gpulse/s optical pulse streams using time delays, as shown in FIG. 8. The effective composite sample rate thereby becomes 72 GSa/s due to the interleaving of the three pulse streams.

Next, the MLL 210 as shown in FIG. 2 will be described in more detail. The pADC 130 of a wide band receiver 100 according to the first embodiment preferably operates with an aperture window of 0.5 ps and pulse to pulse jitter less than 10 fs. These requirements can be met using fiber lasers, such as a 10 GHz repetition rate laser. In the exemplary embodiment, which utilizes interleaving with time delays, an optical pulse stream rate of 24 Gpulses/s is subsequently interleaved to provide an effective rate of 72 Gpulses/s to the microwave samplers 132 of FIG. 8. As shown in FIG. 8, the 24 Gpulses/s optical pulse stream are provided to a microwave sampler 132 on a first optical path without any time delay, the 24 Gpulses/s optical pulse stream are provided to a second microwave sampler 132 with a first time delay provided by a first time delay unit 810 on a second optical path, and the 24 Gpulses/s optical pulse stream are provided to a third microwave sampler 132 with a second time delay provided by a second time delay unit 820 on a third optical path, with the time delay of the second time delay unit 820 being twice that of the time delay provided by the first time delay unit 810. As shown in FIG. 8, a 13.9 ps time delay is used to effectively interleave the 24 Gpulses/s to achieve a 72 GSa/s composite sample rate by the pADC 130 of a wide band receiver 100 of the exemplary embodiment. Interleaving at a different amount other than three, such as five, ten, etc., may be utilized to increase the sampling rate to that of the Nyquist rate, for different embodiments. Each of the microwave samplers 132 shown in FIG. 8 has the same construction as shown in FIG. 7, in which they operate on either non-delayed, slightly-delayed, or more-delayed optical pulses output by the MLL 210.

The control electronics 240 used to control the pADC 130 of the wide band receiver 100 of FIG. 1 provides on-board eADC calibration, timing control, memory, and data processing, to ensure effective and proper operation of the wide band receiver 100. The control electronics 240 can be enabled by way of a PC-based applications program, such as a Labview program, which provides system level instrument control, calibration, and real time data analysis. The analysis may also include the ability to calculate a least squares fit to the digitized signal in order to determine ENOB. Also, a Fourier transform calculation may be used to determine the SFDR (as computed by the PC-based applications program).

The front end 120 of the wide band receiver 100 shown in FIG. 1 includes an oscillator 122 and a mixer 124, which are provided for mixing down the RF signal received by the wide band antenna 110 to an appropriate intermediate frequency. For example, the W band, spanning 75 GHz-110 GHz can be mixed down to an IF band of 0 GHz-35 GHz by a 75 GHz oscillator and mixer. The components making up the front end 120 can be chosen to optimize sensitivity, bandwidth and SFDR in one embodiment.

System performance values for ENOB, Bandwidth and SFDR of a wide band receiver 100 according to an exemplary embodiment are: ENOB=8 bits at 35 GHz, bandwidth is between 0.001 GHz and 35 GHz, and SFDR=75 dBc.

Figure 9:
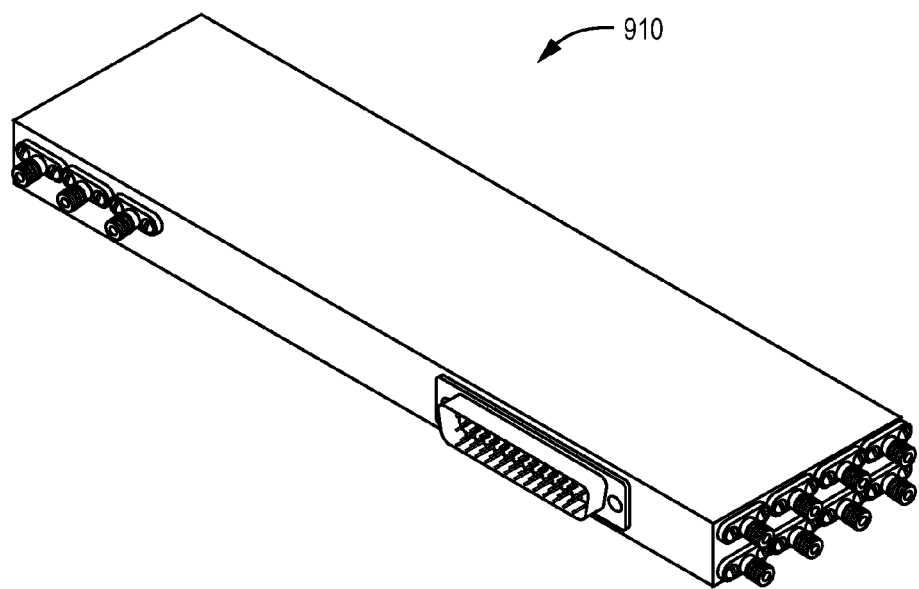
FIG. 9 shows a modular housing implementation for the wide band receiver illustrated in FIG. 1 according to an exemplary embodiment.

FIG. 9 shows a casing or module 910 that can be plugged into a radar system "rack" to implement the wide band receiver of the first embodiment. The casing 910 is rectangular is size, and is 25 long×6.5 wide×2 cm high. The casing 910 can be plugged into and removed from a RF system "rack" such as one that provides processing functions for a doppler radar. The wide band receiver 100 according to the first embodiment can be used for radio receivers, wide band cueing receivers, wide band receives for digital radar, or wide band IF stages for covering a 0 to 110 GHz bandwidth. For example, the wide band receiver 100 can be used with block downconverters to digitize an entire 0 to 110 GHz band in four overlapping channels of 0 to 35 GHz, 30 to 65 GHz, 50 to 85 GHz, and 75 to 110 GHz.

Figure 10:
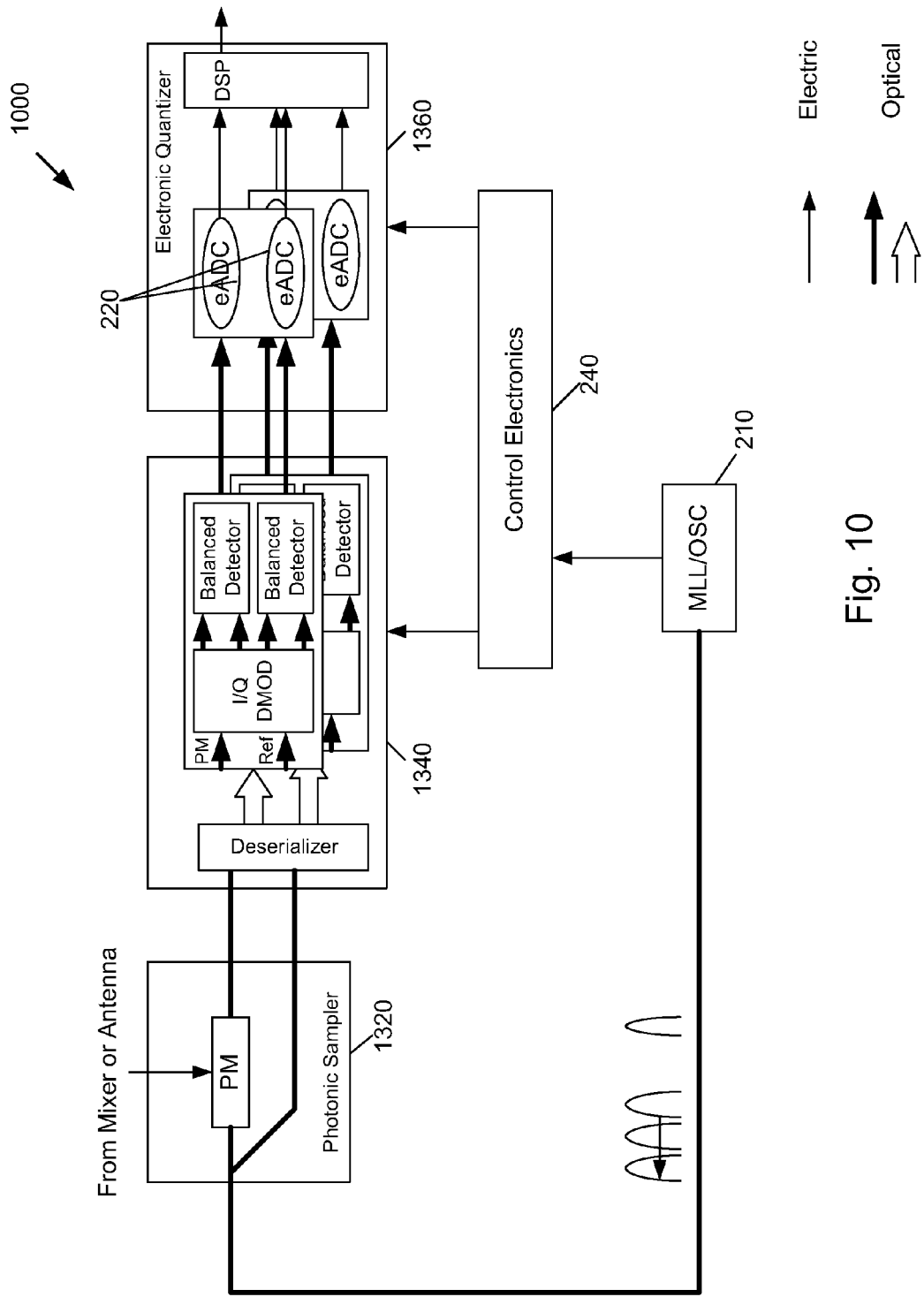
FIG. 10 shows the components making up a wide band digitizer of a wide band receiver 1000 according to a second embodiment.

FIG. 10 shows the components making up a wide band digitizer of a wide band receiver 1000 according to a second embodiment. In the second embodiment, instead of having three separate channels (amplitude, phase and reference) input to a photonic processor as in the first embodiment, there are two separate channels provided to a photonic processor 1340: one being a phase channel and the other being a reference channel. In all other respects, the wide band receiver 1000 is similar in operation to the first embodiment. The use of only two channels is based on the knowledge that the input voltage to the phase modulator PM is proportional to the phase angle in I-Q space. Thus, if one phase rotation is not exceeded in the received signal, then there is no phase ambiguity in the received signal. Consequently, in that case, there would be no need for an amplitude channel to identify the specific phase rotation, such as would be required to remove a $2\pi$ phase ambiguity. Since the phase in this case is always less than $2\pi$, then there is no need for an additional amplitude channel to resolve any phase ambiguity, whereby the second embodiment results in power savings as compared to the first embodiment due to the lesser number of components in the remote sampler 1320, the photonic processor 1340 and the digitizer 1360. Of course, if one phase rotation can be exceeded in the received signal, then the second embodiment may give incorrect results in some instances due to the phase ambiguity of the received signal not being resolved.

Figure 11:
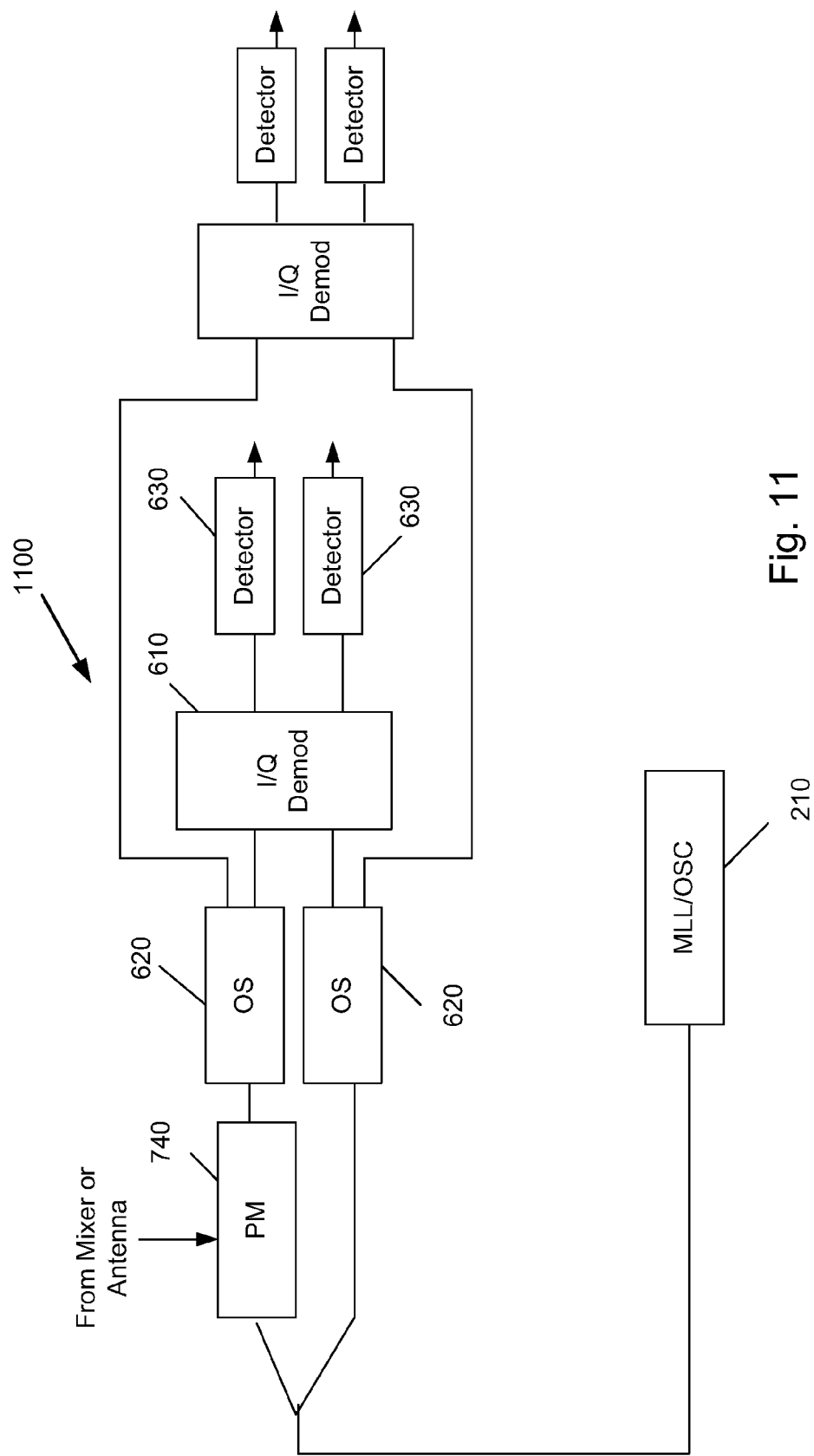
FIG. 11 shows a Wide band RF digitizer nested architecture 1100 according to a third embodiment of the invention.

FIG. 11 shows a Wide band RF nested architecture 1100 according to a third embodiment of the invention, which provides nesting of two-channel photonic processors of the second embodiment (whereby nesting could alternatively be done with three-channel photonic processors of the first embodiment). In FIG. 11, the output of a remote sampler 1110 is provided to both a first photonic processor 1120 and a second photonic processor 1130 in a nesting arrangement. While FIG. 11 is shown with respect to two-channel photonic processors 112, 11300, three-channel photonic processors can alternatively be arranged in a nesting arrangement.

Figure 12:
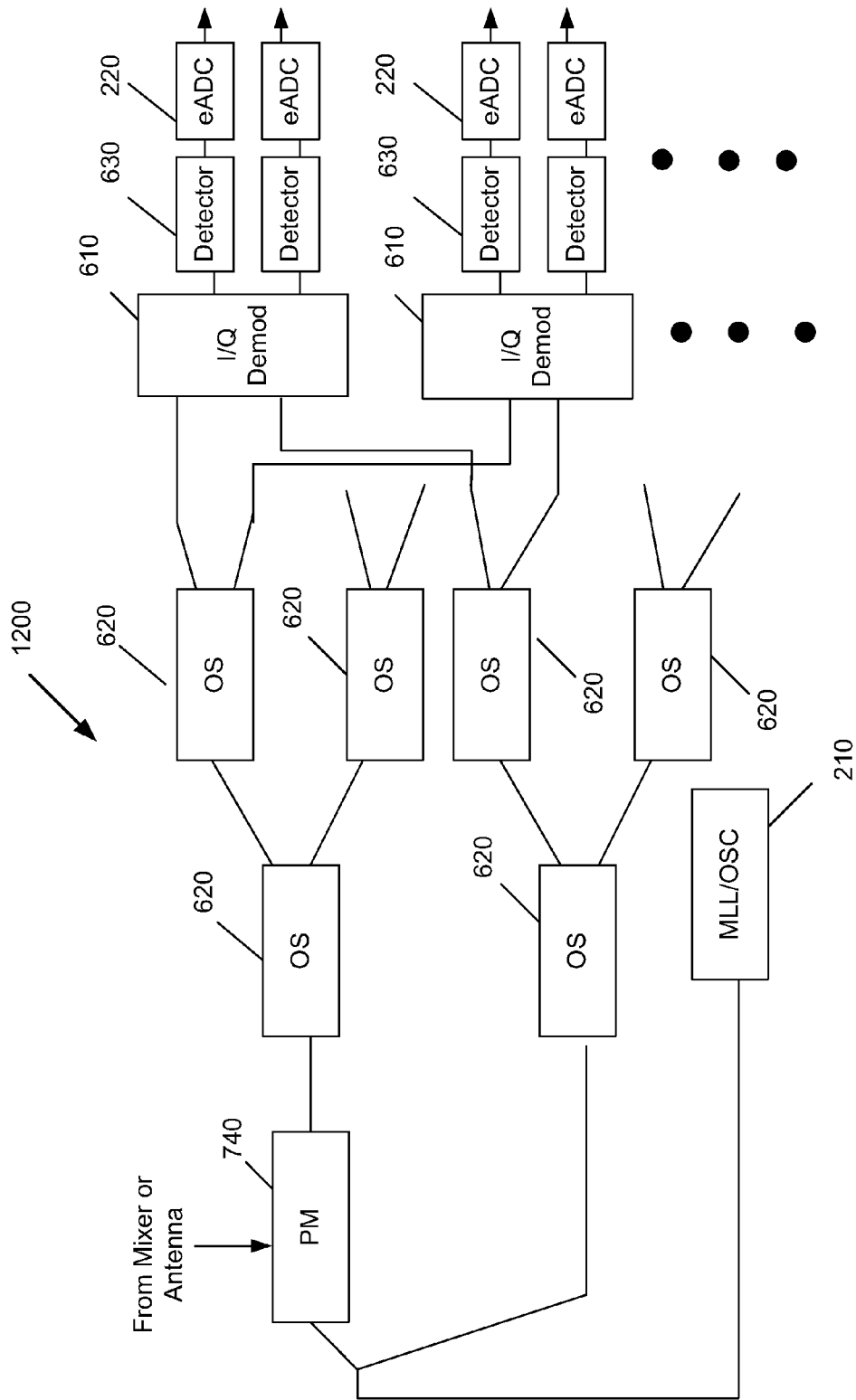
FIG. 12 shows a Wide band RF digitizer tree architecture 1200 according to a fourth embodiment of the invention.

FIG. 12 shows a Wide band RF tree architecture 1200 according to a fourth embodiment of the invention, whereby the optical switches 620 are arranged in a tree configuration.

Figure 13:
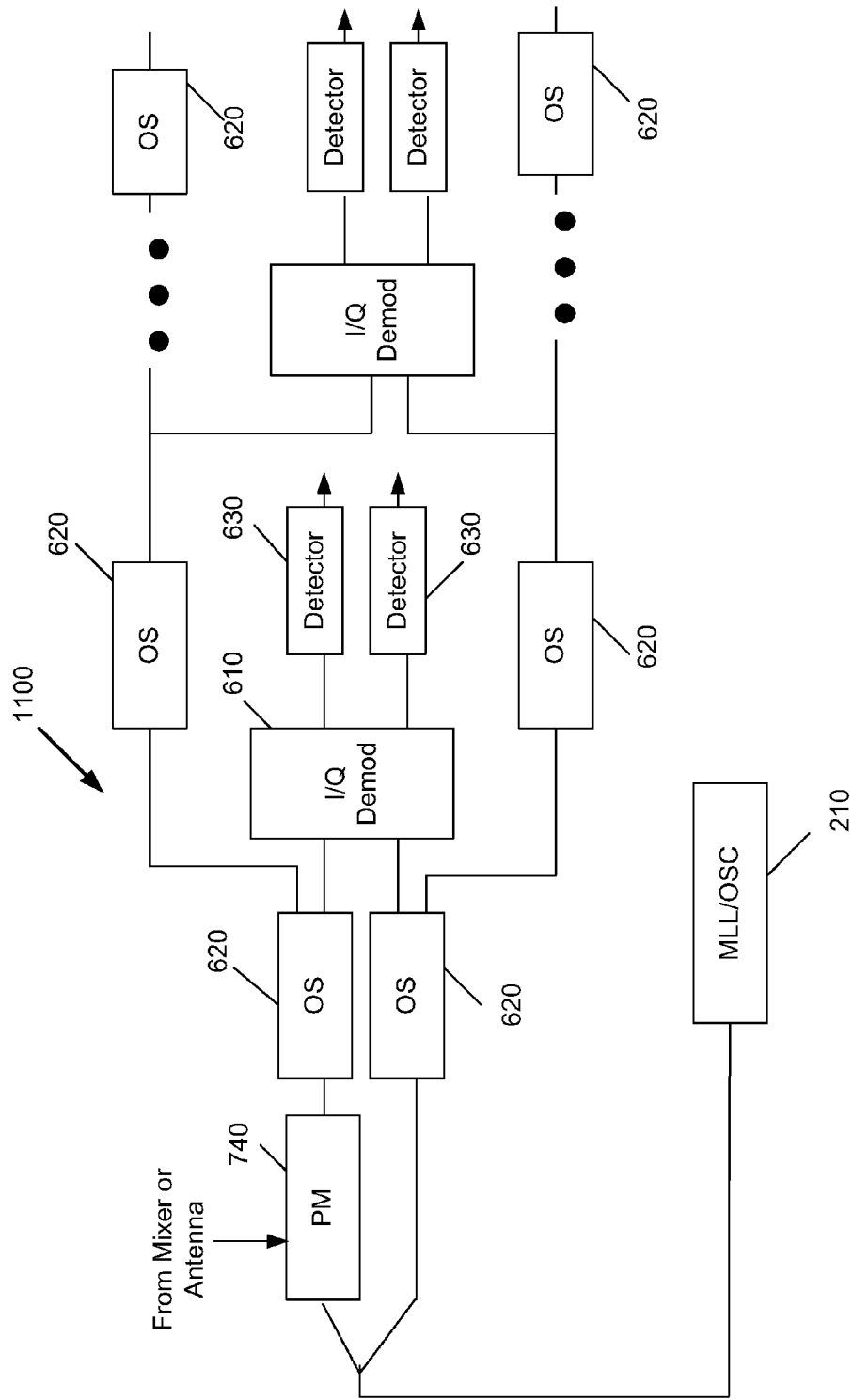
FIG. 13 shows a Wide band RF digitizer pipeline architecture 1300 according to a fifth embodiment of the invention.

FIG. 13 shows a Wide band RF pipeline architecture 1300 according to a fifth embodiment of the invention, whereby photonic processors 1310 are arranged in a pipeline configuration. While FIG. 13 is shown with respect to two-channel photonic processors 1310, three-channel photonic processors can alternatively be arranged in a pipeline configuration.

Figure 14:
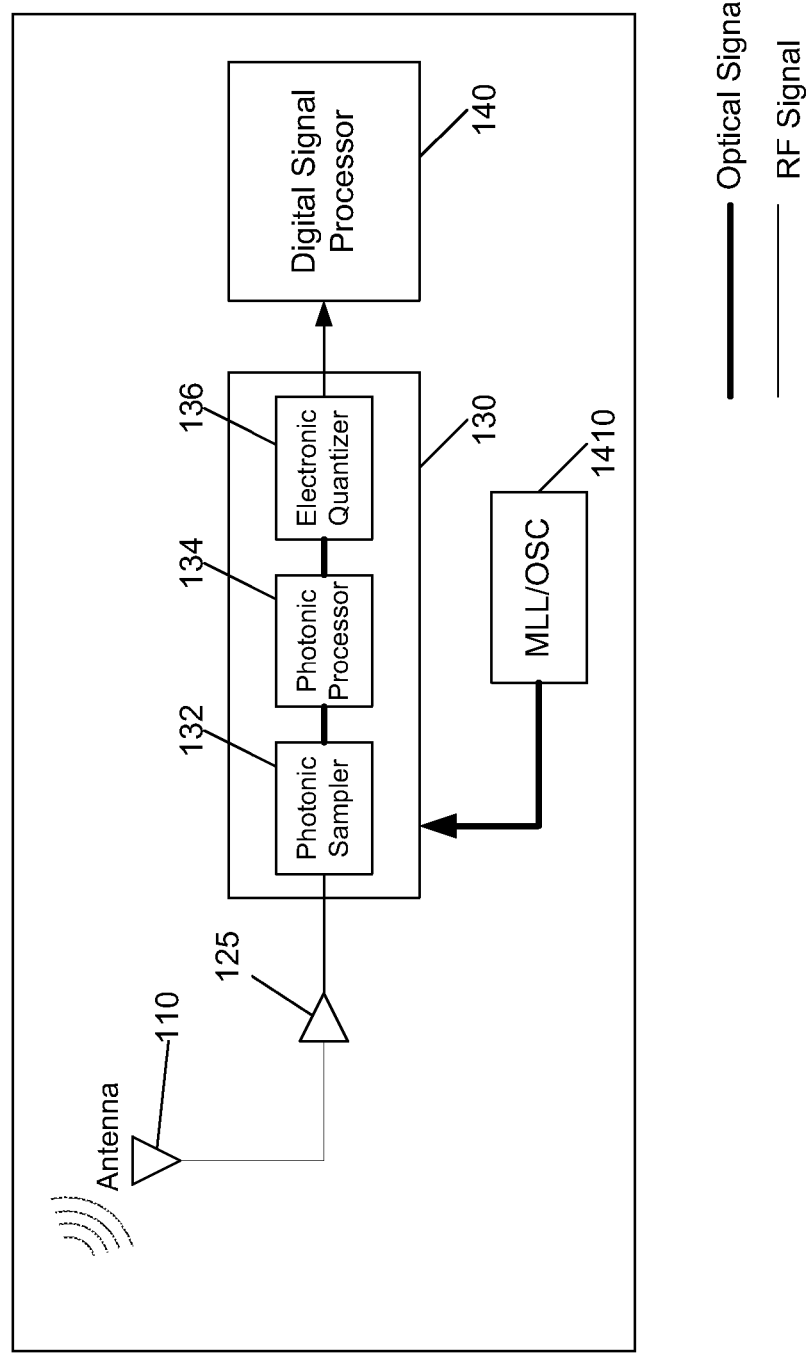
FIG. 14 shows the components making up a wide band digitizer of a wide band receiver 1400 according to a sixth embodiment.

FIG. 14 shows the components making up a wide band digitizer of a wide band receiver 1400 according to a sixth embodiment, in which an rf signal received by an antenna 110 is provided to a low noise amplifier (LNA) 125, and the output of the LNA 125 is provided to a pADC 130 for conversion to a digital output, and in which the digital output of the pADC is provided to a digital signal processor 140 for further processing (e.g., signal-to-noise enhancement, digital image processing, etc.). An optical clock 1410 provides optical pulses to the pADC 130.

Figure 15:
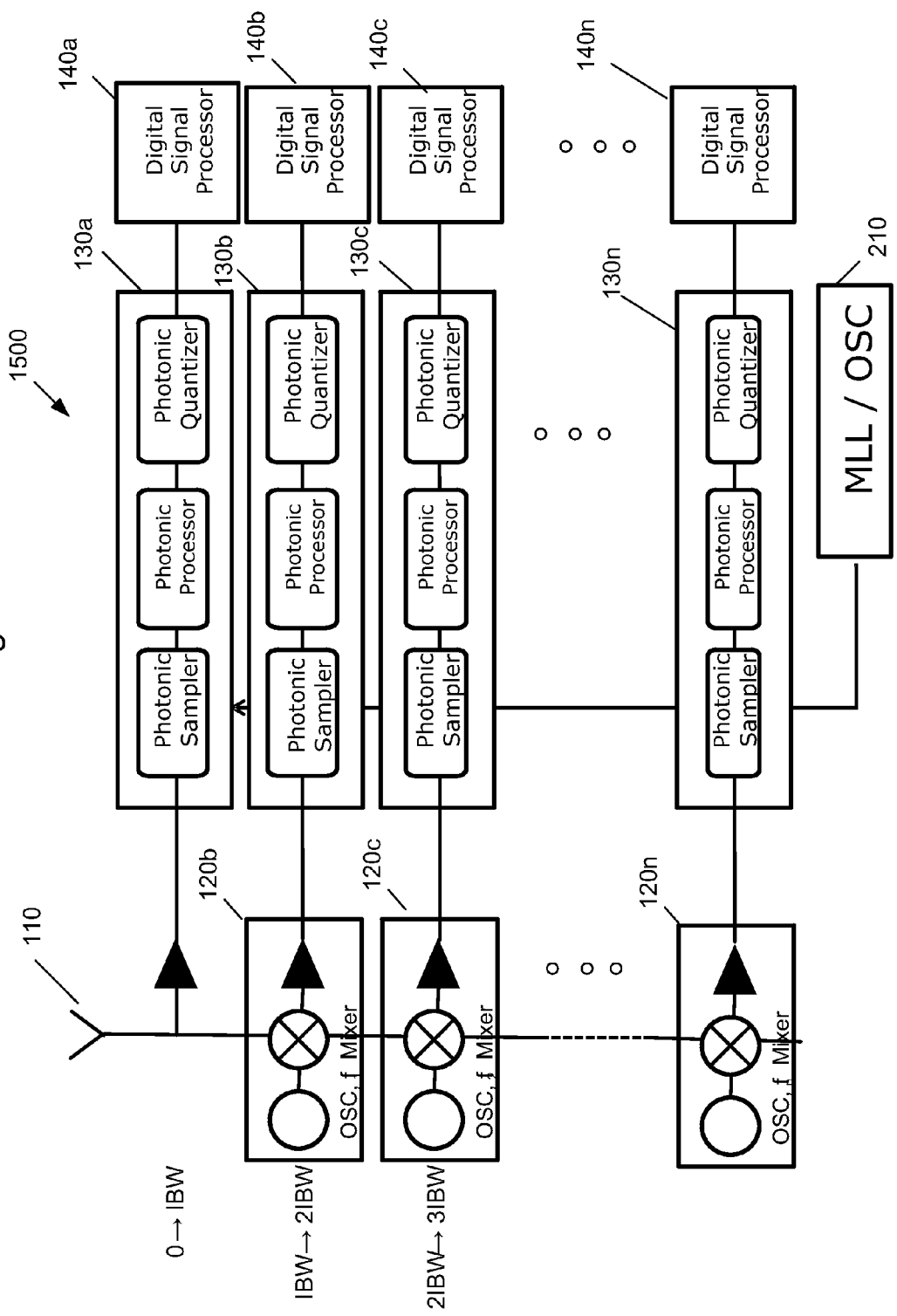
FIG. 15 shows the components making up a wide band digitizer of a wide band receiver 1400 according to a seventh embodiment, in which a signal from an antenna having a bandwidth greater than the instantaneous bandwidth (IBW) of a wide band digitizer is demultiplexed and downconverted into multiple bands suitable for digitization by a wide band digitizer.

FIG. 15 shows the components making up a wide band digitizer of a wide band receiver 1500 according to a seventh embodiment, in which the signal received by an antenna 110 having a bandwidth greater than the instantaneous bandwidth (IBW) of the pADC is demultiplexed and downconverted into multiple bands suitable for digitization by a pADC. In particular, separate photonic samplers 120*b*, 120*c*, . . . , 120*n*, separate pADCs 130*a*, 130*b*, . . . , 130*n*, and separate digital signal processors 140*a*, 140*b*, . . . , 140*n* are utilized to provide separate processing channels for processing a wide band signal simultaneously across those channels The instantaneous bandwidth (IBW) of each of the channels 1 to N is set such that the pADCs 130*a*, 130*b*, . . . , 130*n* can adequately process the signals on those channels.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of optical component, dimensions and angles are mentioned, other components, dimensions and angles can be utilized. Also, while the wide band digitizer system and method has been described above with respect to inclusion in a wide band receiver, it can be implemented in other types of high-frequency band receivers, such as receivers operating up to hundreds of GHz. Various changes may be made to the details disclosed without departing from the spirit of the invention which is defined by the following claims.

What is claimed is:

1. A wide band digitizer of a receiver receiving an IF signal associated with an RF signal, the wide band digitizer comprising:

a photonic Analog-to-Digital Converter (pADC); and
a digital processor;
wherein the pADC comprises:
   a photonic sampler configured to phase-encode a stream of optical pulses with the IF signal to obtain phase-encoded optical pulses, and to amplitude-encode another identical stream of optical pulses with the IF signal to obtain amplitude-encoded optical pulses;

a photonic processor; and an electronic quantizer, wherein the photonic processor processes the phase-encoded optical pulses using an I channel and a Q channel, and processes the amplitude-encoded optical pulses using an amplitude channel.

2. The wide band digitizer according to claim 1, wherein the photonic processor comprises:

an I/Q demodulator configured to demodulate the phase-encoded optical pulses into an I channel and a Q channel;

wherein the demodulator also receives a reference portion of the stream of optical signals that have not been encoded with the IF signal, to use in demodulating the phase-encoded optical pulses;

three photodetectors configured to convert optical signals to electronic signals;

wherein a first one of the photodetectors converts the I channel signal, a second one of the photodetectors converts the Q channel signal, and a third one of the photodetectors converts the amplitude channel signal.

3. The wide band digitizer according to claim 2, wherein the photonic sampler comprises:

a splitter configured to split the stream of optical pulses onto first, second and third optical paths;

an amplitude modulator configured to amplitude-modulate the stream of optical pulses provided on the first path with the IF signal; and a phase modulator configured to phase-modulate stream of optical pulses provided on the second path with the IF signal, wherein the stream of optical pulses provided on the third path is a reference input to the I/Q demodulator for use in demodulating the phase-encoded optical pulses into the I channel and on the Q channel.

4. The wide-band RF stage according to claim 1, wherein the photonic processor comprises:

a plurality of I/Q demodulators;

a plurality of optical switches; and a plurality of photodetectors that convert optical signals into electronic signals, wherein the plurality of optical switches are three in number, one for each of the phase, reference and amplitude channels, wherein the plurality of I/Q demodulators are two in number wherein the plurality of photodetectors are six in number, two for each of the I, Q and amplitude channels.

5. The wide band digitizer according to claim 4, wherein the electronic quantizer comprises:

a plurality of electronic A/D converters (eADCs) performing A/D conversion on the electronic signals output by the photodetectors, wherein the eADCs are six in number, two for each of the I, Q and amplitude channels.

6. The wide band digitizer according to claim 4, wherein the photodetectors are balanced photodetectors.

7. The wide band digitizer according to claim 1, wherein the RF front end comprises:

an oscillator; and a mixer, wherein the mixer is configured to mix the RF signal with an oscillation signal output by the oscillator and to output the IF signal as a result thereof.

8. A method of processing an RF signal at an IF stage of a receiver, the method comprising:

converting, by a receiver front end, the RF signal into an IF signal;

phase-encoding, by a photonic sampler, a stream of optical pulses with the IF signal to obtain phase-encoded optical pulses, amplitude-encoding, by the photonic sampler, an identical stream of optical pulses with the IF signal to obtain amplitude-encoded optical pulses;

processing, by a photonic processor, the phase-encoded optical pulses by way of an I channel and a Q channel; and processing, by the photonic processor, the amplitude-encoded optical pulses by way of an amplitude channel.

9. The method according to claim 8, wherein the processing steps comprise:

demodulating the phase encoded signal into I and Q channels;

receiving a portion of the stream of optical signals that have not been encoded with the IF signal, to use as a reference in demodulating the phase-encoded optical pulses received.

10. The method according to claim 9, further comprising:

splitting the stream of optical pulses onto first, second and third optical paths;

amplitude-modulating the stream of optical pulses provided on the first path with the IF signal; and phase-modulating the stream of optical pulses provided on the second path with the IF signal, wherein the stream of optical pulses provided on the third path are input to the demodulator for use as a reference in demodulating the phase-encoded optical pulses into the I channel and the Q channel.

11. The method according to claim 8, wherein the converting step comprises:

mixing the RF signal with an oscillation signal provided by an oscillator, and obtaining the IF signal as a result thereof.

12. The method according to claim 8, further comprising:

outputting, by a mode locked laser, the stream of optical pulses onto an optical path.

13. The method according to claim 8, wherein the converting comprises:

mixing the RF signal with an oscillating signal output by an oscillator.

14. A non-transitory computer readable medium storing computer program code, which, when executed by a computer, causes the computer to process an RF signal at an IF stage of a receiver by performing the functions of:

converting the RF signal into an IF signal;

phase-encoding the IF signal with a stream of optical pulses to obtain phase-encoded optical pulses, and to amplitude-encode the IF signal with the stream of optical pulses to obtain amplitude-encoded optical pulses;

amplitude-encoding the IF signal with the stream of optical pulses to obtain amplitude-encoded optical pulses;

processing the phase-encoded optical pulses by way of an I channel and a Q channel; and processing the amplitude-encoded optical pulses by way of an amplitude channel.

15. The non-transitory computer readable medium according to claim 14, wherein the processing functions comprise:

demodulating the phase-encoded optical pulses on the I channel;

demodulating the phase-encoded optical pulses on the Q channel; and receiving a portion of the stream of optical signals that have not been encoded with the IF signal, to use in demodulating the phase-encoded optical pulses received on the I channel and on the Q channel.

16. The non-transitory computer readable medium according to claim 14, the computer further performing the functions of:

splitting the stream of optical pulses onto first, second and third optical paths;

amplitude-modulating the IF signal with the stream of optical pulses provided on the first path; and phase-modulating the IF signal with the stream of optical pulses provided on the second path, wherein the stream of optical pulses provided on the third path are input to the first and second demodulators for use in demodulating the phase-encoded optical pulses on the I channel and on the Q channel.

17. The non-transitory computer readable medium according to claim 14, wherein the converting function comprises:

mixing the RF signal with an oscillation signal, and outputting the IF signal as a result thereof.

18. The non-transitory computer readable medium according to claim 14, the computer further performing the function of:

controlling output of the stream of optical pulses onto an optical path.

19. The non-transitory computer readable medium according to claim 14, wherein the converting comprises:

mixing the RF signal with an oscillating signal output by an oscillator, and obtaining the IF signal as a result thereof.

* * * * *